United States Patent [19]

Schulz et al.

[11] Patent Number: 4,740,164

[45] Date of Patent: Apr. 26, 1988

[54] CIRCUIT BOARD INSERTER/EXTRACTOR

[75] Inventors: Kenneth A. Schulz, Bethel; David H. Brooks, Jr., Wilton; George H. Woods, Fairfield, all of Conn.

[73] Assignee: Pitney Bowes Inc., Stamford, Conn.

[21] Appl. No.: 77,135

[22] Filed: Jul. 23, 1987

[51] Int. Cl.⁴ .............................................. H05K 1/00
[52] U.S. Cl. .................................... 439/64; 439/152; 439/157
[58] Field of Search ............... 439/152, 153, 155, 157, 439/159, 160, 180, 59, 61, 62, 259, 260, 261, 64; 361/412, 413, 414, 415

[56] References Cited

U.S. PATENT DOCUMENTS

| | | | |
|---|---|---|---|
| 3,853,379 | 12/1974 | Goodman et al. | 439/261 |
| 4,064,551 | 12/1977 | Lightfoot | 439/155 |
| 4,083,616 | 4/1978 | McNiece et al. | 439/157 |
| 4,301,494 | 11/1981 | Jordan | 439/160 |
| 4,313,150 | 1/1982 | Chu | 439/160 |
| 4,445,740 | 5/1984 | Wallace | 439/152 |
| 4,636,065 | 1/1987 | Kanemitsu et al. | 355/75 |
| 4,694,380 | 9/1987 | Mallory et al. | 361/415 |
| 4,698,024 | 10/1987 | Maxwell | 439/160 |

*Primary Examiner*—David Pirlot

*Attorney, Agent, or Firm*—Gerald E. Linden; David E. Pitchenik; Melvin J. Scolnick

[57] ABSTRACT

Insertion and extraction of a circuit board (40) into and from a car guide (10) is aided by a lever-like, rigid, elongated member (66) hingedly attached at one hinged end (62) thereof to one side (22) of the card guide (10). The other nonhinged end (64) of the member (66) is manipulatable so that the member (66) may be moved between an open and a closed position. A bump (70) on the member (66) contacts the trailing edge (44) of the circuit board during insertion as the member (66) is moved to its closed position. In the closed position, the member (66) extends from one hinge side (22) of the card guide (10) to the other nonhinge side (12) thereof. A locking device (94) on the nonhinge side (12) of the card guide (10) releasably engages the nonhinge end (64) of the member (66) in the closed position. For extracting the circuit board (40) from the card guide (10), the member (66) is moved towards its open position and a barbed portion (80) of the member (66) engages a hole (50) in a trailing edge region of the circuit board (40). The topography of the barbed portion (80), notably that of a region (100) of increased thickness disposed thereon and forming a step (106), is such that it ultimately releases itself from the hole (50).

12 Claims, 5 Drawing Sheets

CIRCUIT BOARD INSERTER/EXTRACTOR

TECHNICAL FIELD OF THE INVENTION

The invention relates to circuit board guides (card guides) having slots for receiving two opposed side edges of a circuit board and, more particularly, to a device aiding in the insertion and extraction, respectively, of circuit boards into and from card guides.

BACKGROUND OF THE INVENTION

The inserter/extractor disclosed herein is applicable to printed circuit boards, integrated circuit mother boards, and the like.

It is common to require several circuit boards to be inserted in closely-spaced parallel relationship into a card guide. To this end, each board would be grasped by its trailing edge and urged leading edge first into the card guide which has slots receiving the opposed side edges of the circuit board. A contact arrangement on the leading edge of the circuit board engages an electrical connector when the circuit board is fully inserted into the card guide. For insertion of a circuit board, tight board-to-board spacing is typically not a problem since there is almost universally trailing edge alignment between all of the circuit boards when they are fully inserted. However, with respect to extraction of a circuit board, tight board-to-board spacing can present an obstacle to firmly grasping the trailing edge of the circuit board.

It is known to provide a cam lever, pivotally attached to a trailing edge corner of a circuit board to facilitate circuit board removal. The camming action of such a device against the card guide provides only a limited amount of extraction, and the device does not aid in circuit board insertion. Furthermore, the expense of such a device is reflected in every board that may be inserted into the card guide.

It is also known to provide a hole through the circuit board in a trailing edge region thereof, preferably large enough that one could insert a fingertip into the hole for extracting the circuit board. When tight board spacing disallows the use of a fingertip for extraction, it is known to provide a separate hooked tool to "catch" the hole. Tools, of course, have a propensity for not being available when needed.

Thus, it is an object of the present invention to provide a device that aids in both the insertion and extraction of circuit boards in card guides, and that is integral with the card guide.

DISCLOSURE OF THE INVENTION

According to the invention, a lever-like, rigid, elongated member is hingedly attached at one end to one side of a card guide. In an open position, the member is "out of the way" and allows a circuit board to be partially inserted into the card guide. When the member is moved towards its closed position, it contacts the trailing edge of the circuit board and urges further, and finally full insertion of the circuit board. A barbed projection on the member engages the trailing edge of a hole in the circuit board so that movement of the member from its closed position towards its open position causes circuit board extraction.

According to an aspect of the invention, a longitudinal slot in the member allows a trailing edge corner of the circuit board to pass through a portion the member at positions intermediate the open and closed positions in a noninterferential manner.

According to a feature of the invention, a locking device is disposed on the other, nonhinged side of the card guide so as to releasably retain the member in its closed position and lock the circuit board in its fully inserted condition. This feature is beneficial not only for locking the board in position, but also for providing both tactile and visual indications of full insertion.

Other objects, features, and advantages of the invention will become apparent in light of the following description thereof.

DETAILED DESCRIPTION OF THE INVENTION

Figure 1:
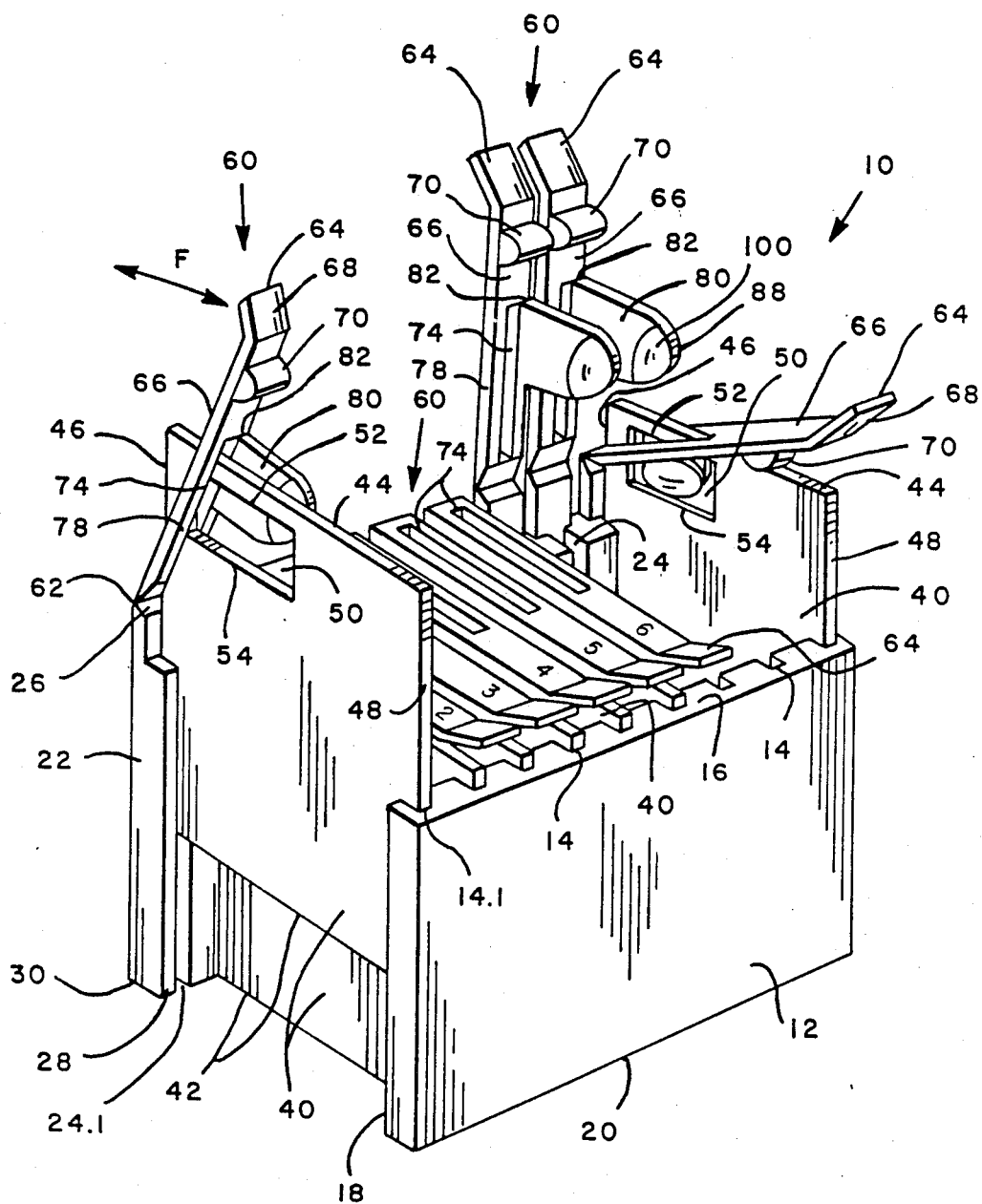
FIG. 1 is a perspective view of a card guide receiving circuit boards, illustrating generally the invention and its use.

FIG. 1 shows a card guide 10. One side 12 of the card guide is provided with nine parallel slots 14, each slot extending from a front edge 16 of the side 12, along its interior face 18, to a back edge 20 of the side 12. Another side 22 of the card guide is provided with nine parallel slots 24, each slot extending from a front edge 26 of the side 22, along its interior face 28, to a back edge 30 of the side 22. The interior faces 18 and 28 of the sides 12 and 22, respectively, are parallel to and face each other so that cooperating, circuit board-receiving slot pairs, for instance those particularly designated 14.1 and 24.1, are established.

Circuit boards 40 each have a leading edge 42, a trailing edge 44, a first side edge 46 and an opposed second side edge 48, the edges 42–48 defining a rectangle. Through a trailing edge corner portion of the board, just inward of the trailing edge 44, there is disposed an opening 50. The opening 50 has a trailing straight edge 52 parallel to and on the order of approximately one fifth inch (5 mm) from the trailing edge 44 of the board 40 and a leading straight edge 54 parallel to and on the order of seven tenths inch (18 mm) from the trailing edge 44 of the board 40. It has been known to provide such a hole 50 in circuit boards so as to accommodate a human digit for extraction of a circuit board. In that context, the straightness of the trailing and leading edges of the hole is not critical, only its size.

According to the invention, the trailing edge 44 of the circuit board 40 and the trailing edge 52 of the hole 50 therethrough cooperate with an apparatus 60 associated with the card guide 10 so as to facilitate insertion and extraction, respectively, of a circuit board into and from, respectively, the card guide. The apparatus 60 is lever-like, hingedly attached at one end 62 to the front edge 26 of the side 22 of the card guide, such as by a "living hinge" (as shown) or by a pin, and movable by a force, F, applied to the other end 64 thereof in a range of positions between two positions — an open position wherein the lever 60 allows for insertion of a circuit board thereby, and a closed position wherein the lever 60 extends generally from the side 22 to the side 12 of the card guide. In the embodiment shown, the range of positions encompasses approximately 150 degrees. It will become evident that the front edge 26 of the side 22 of the card guide should extend sufficiently beyond the trailing edge of a circuit board fully inserted into the card guide so that the lever 60 can clear the trailing edge of the circuit board in its closed position.

In FIG. 1, circuit boards 40 are shown at various stages of insertion into corresponding seven slot pairs of the card guide. The cooperative action of the lever 60 and the circuit board is also shown in FIGS. 4A and 4B through 13A and 13B for various stages of insertion/extraction.

As best viewed in FIG. 2, the lever 60 is formed as follows:

A rigid, elongated member 66 is suitably formed at one end 62 for hingedly attaching the member 66 to the front edge 26 of the side 22 of the card guide. In the case of a "living hinge", the member 66 would be made of plastic and the end 62 would taper down in thickness, as shown, so that at its extremity it would be flexible. One will readily recognize that to achieve such a living hinge embodiment, the lever 60 would preferably be formed integrally with the side 22 of the card guide from a suitable material, such as propylene. Alternatively, although not shown, the hinged end 62 would be provided with a hole to receive a pin gudgeoned to the front edge 26 of the side 22 to allow for appropriate lever movement.

At the other, nonhinged end 64 of the member 66, in an end region 68, the member is angled slightly, on the order of 30 degrees, upward (i.e. ultimately away from the trailing edge of an inserted circuit board). The end region 68 provides a "handle" by which a user would provide the force F, and thus manipulate the lever for insertion and extraction of a circuit board.

Slightly inward of the end region 68, a bump 70 projects from the underside 72 of the member 66, extending transversely its width, ultimately toward the trailing edge of an inserted circuit board. The bump 70 is disposed at a somewhat critical position along the length of the member 66, with respect to the trailing edge of a circuit board being inserted, so that it comes into contact therewith during the final stage of the lever-assisted insertion operation wherein the leading edge of the circuit board engages a connector, and so that the bump contacts the trailing edge of the circuit board away from the hole. This will be evident hereinafter, and a limited amount of sliding is involved between the bump and the trailing edge of a circuit board. Hence, a self-lubricating plastic material is suitable for the member 66.

In the embodiment shown, the bump 70 is semicylindrical, having a flat surface 70A and a rounded surface 70B, the flat surface being contiguous with the underside 72 of the member 66, and the rounded surface ultimately contacting the trailing edge 44 of the circuit board 40. The thickness of the bump 70 is approximately four times the thickness of circuit board, but could be more or less, even zero. But with zero thickness the point of contact would be the underside 72 of the member 66 itself which, for design reasons, is deemed not desirable.

From substantially the hinged end 62 to substantially the bump 70, the member 66 is bifurcated by a longitudinally extending slot 74 that cuts through the member 66 from the underside 72 to the top surface 76 thereof, defining two bifurcated portions 78 of the member 66. As will be evident, the slot 74 is dimensioned so that a trailing edge corner of a circuit board being inserted can fit through the slot. To this end, the length of the slot is approximately one third to one half the length of the trailing edge of a circuit board.

Figure 2:
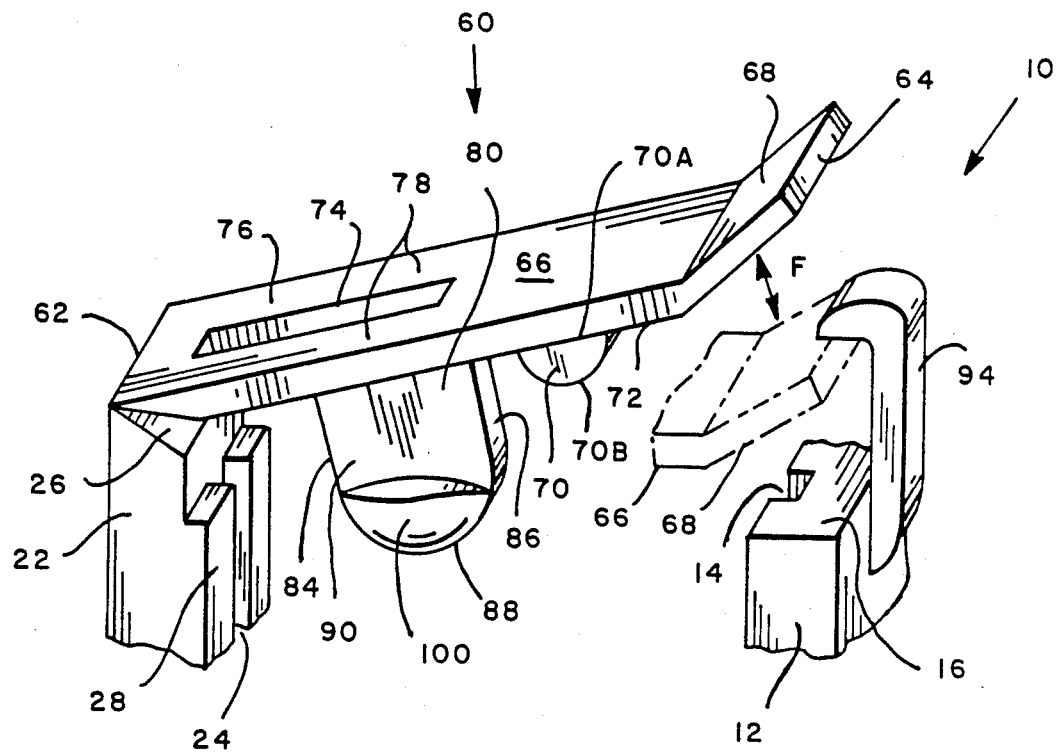
FIG. 2 is a detailed perspective view of the invention.

FIG. 2 shows a locking device 94 integrally formed with the front end 16 of the nonhinge side 12 of the card guide 10. (The locking device 94 is not shown in FIG. 1, for clarity.) When the member 66 is in its closed position, as indicated by dashed lines, the nonhinged end 64 of the member is captivated by the locking device 94. The locking device 94 should be sized and located so as to allow a circuit board to be inserted freely thereby into the slot 14. Furthermore, the locking device should be sized so as to require a slight, such as 0.030 inch (1 mm), deflection (downward, as shown) of the handle portion 68 of the member 66 past the position at which the circuit board is fully inserted, before engaging the member 66. This will ensure a positive, yet releasable locking of the member in its closed position.

At a suitable position along the length of the member 66, a barbed portion 80 of the member 66 extends orthogonally away from the underside 72 of the member 66. As will be evident hereinafter, the location and configuration of the barbed portion 80 is selected to cooperate with the hole 50 of the circuit board 40 to assist in the insertion and extraction of the circuit board via manipulation of the member 66. In the embodiment shown, the barbed projection 80 is located between the bump 70 and the hinged end 62 of the member 66.

The barbed portion 80 is generally a rectangular solid; having a base edge 82 (not visible in FIG. 2) integrally formed with the underside of the member 66, two side edges, an inward side edge 84 and an outward side edge 86 extending perpendicularly away from the underside 72 of the member 66, a leading edge 88 which is preferably rounded, an inner surface 90, and an outer surface 92 (not visible in FIG. 2). The thickness, of the barbed projection 80 is defined by its inner and outer surfaces, and is approximately equal to the thickness of the circuit board 40. The barbed projection 80 is offset to one side of the member 66, such as by extending from one of the bifurcated portions 78 of the member.

A region 100 of increased thickness is formed on the inner surface 90 of the barbed portion 80 as follows. The region 100 extends from the leading edge 88 of the barbed portion 80, where its thickness is substantially zero, approximately one quarter the distance towards the base edge 82 of the barbed projection 80, where its thickness is greater.

Figure 3A:
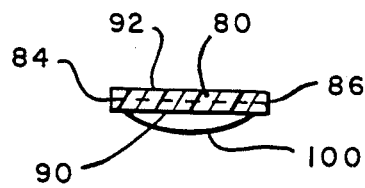
FIGS. 3A, 3B and 3C are orthogonal views of a portion of the invention.
Figure 3B:
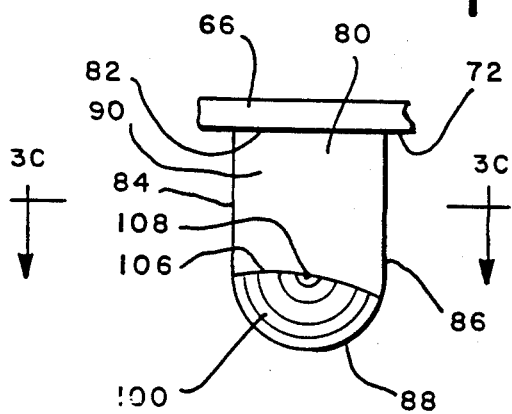
Figure 3C:
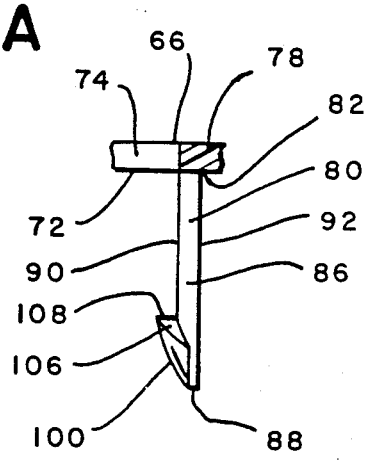

The topography of the region 100 is better understood in light of the orthoganal views of FIGS. 3A, 3B and 3C. As shown, the thickness of the region 100 increases from zero at the leading edge 88 of the barbed projection 80, towards the base edge 82 where it forms a step 106 extending generally perpendicularly and approximately three-quarters of the distance across the barbed projection 80 from the inward side edge 84 thereof towards the outward side edge 86 thereof. The step 106 itself tapers to nearly zero thickness at both ends thereof, and is of maximum thickness, approximately equal to the thickness of circuit board, at a point 108 which is approximately midway between the two side edges 84 and 86 of the barbed projection 80. Lines indicating locations of equal thickness, in 25% increments from zero to maximum (100%) are shown in FIG. 3A.

FIGS. 4A and 4B, 5A and 5B, 6A and 6B, 7A and 7B, 8A and 8B, 9A and 9B, 10A and 10B, 11A and 11B, 12A and 12B, and 13A and 13B show sequentially the member 66 in conjunction with the insertion, then extraction of a circuit board 40 from A card guide 10. The "A" views are side views in full, and the "B" views are corresponding end views in section. The locking device 94 is omitted from these views, for clarity.

Figure 4A:
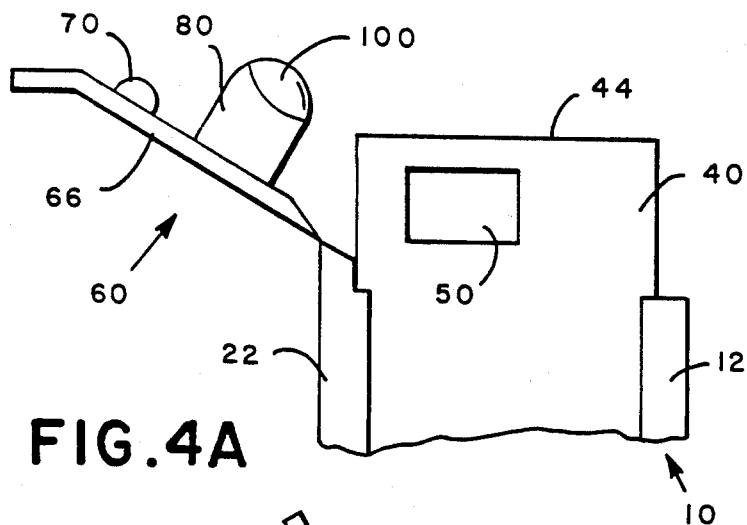
FIGS. 4A and 4B, 5A and 5B, 6A and 6B, 7A and 7B, and 8A and 8B, 9A and 9B, 10A,10B, 11A and 11B, 12A and 12B, and 13A and 13B are side ("A" view) and end cross-sectional ("B" view) views, respectively, of the invention, as employed in a sequence of inserting, then extracting a circuit board from a card guide.
Figure 4B:
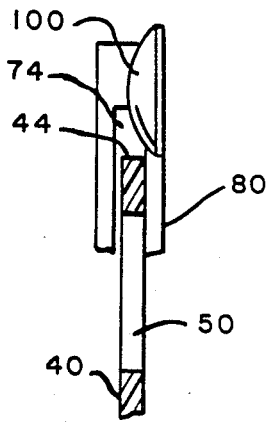

In FIGS. 4A and 4B, the member 66 is shown in its open position allowing for the circuit board 40 to be partially inserted by hand into the card guide 10. In this position the member 66, most notably the barbed portion 80 thereof, is clear of a vertical (as shown) line extending upward from the hinge (left, as shown) side 22 of the card guide. In FIG. 4B the slot 74 is visibly slightly, such as 30%, wider than the thickness of the circuit board.

Figure 5A:
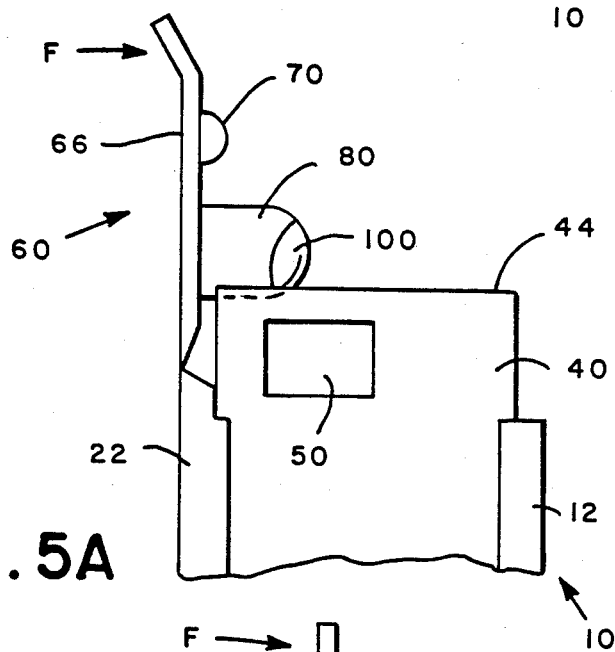
Figure 5B:
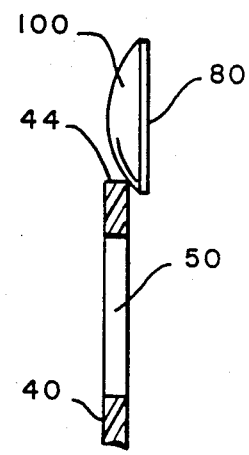
Figure 6A:
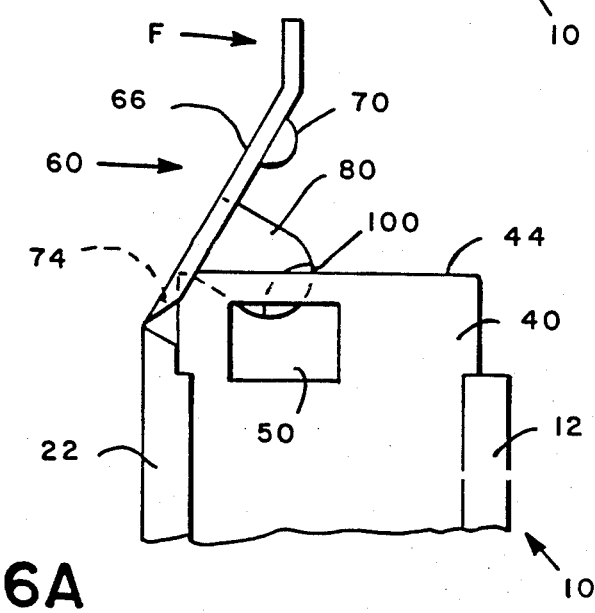
Figure 6B:
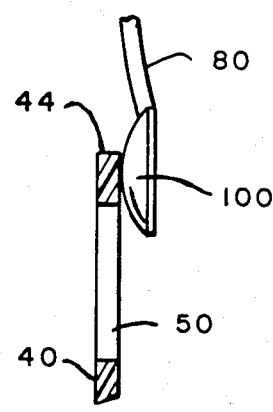

In FIGS. 5A and 5B, the card 40 is further inserted into the card guide 10 as a result of the member 66 being displaced towards its closed position. As shown, the region of increased thickness 100 on the barbed portion 80 contacts the trailing edge 44 of the circuit board. Subsequent displacement of the member 66 towards its closed position is likely to cause the circuit board to be more inserted into the card guide (i.e., to move downward as shown) until the resistance of the circuit board to further insertion is greater than the combined stiffness of the barbed portion 80 and coefficient of friction of the region 100, at which point further closing force applied to the member 66 will cause the barbed portion 80 to deflect, as shown in FIGS. 6A and 6B. This initial insertion action by the member 66 is, for the reasons discussed, necessarily somewhat indeterminate.

In FIGS. 6A and 6B, the barbed portion 80 is shown to have deflected, no longer exerting a downward force on the trailing edge 44 of the circuit board 40. Consequently the member 66 is rather free to be moved more towards its closed position, unimpaired by any resistance of the circuit board further insertion. The function of the longitudinal slot 74 through the member 66 is dramatically demonstrated in FIG. 6A, wherein a trailing edge corner of the circuit board 40 can be viewed entering the slot 74. Without the slot 74, and without other compensatory configurational changes to the member 66 such as increasing the protuberance of the bump 70, the underside 72 of the member would contact the trailing edge 44 of the circuit board 40 directly, and could likely produce a skewed insertion force.

Figure 7A:
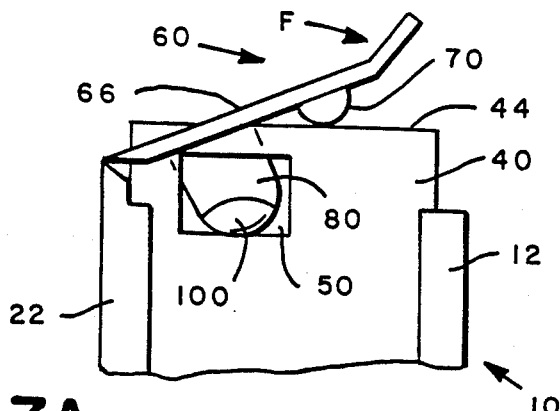
Figure 7B:
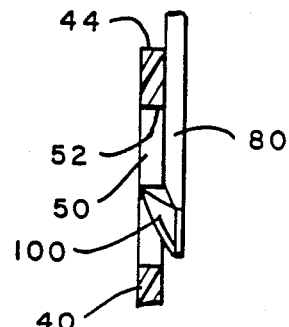

In FIGS. 7A and 7B, the member 66 is further displaced towards its closed position, sufficiently that the bump 70 has contacted the trailing edge 44 of the circuit board 40. This contact is very definite and determinate, since the bump is wider, by a factor of approximately five times, than the circuit board. Thus, the closing force F on the member 66 is directly imparted to the circuit board 40. (There is a slight loss of "efficiency" due to the angle of the member 66 with respect to the trailing edge of the circuit board). This affirmative contact between the member 66 and the circuit board 40 is advantageous in the context of the leading edge of the circuit board engaging a connector (not shown).

Figure 8A:
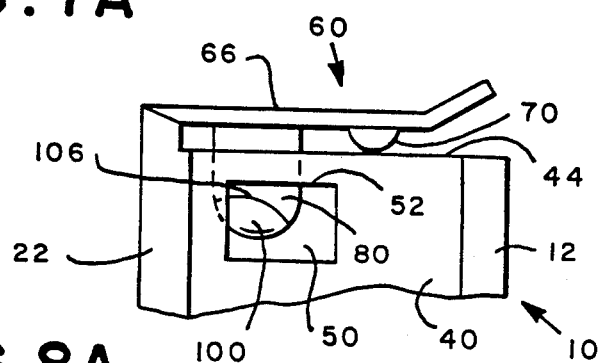
Figure 8B:
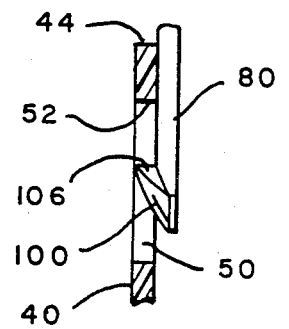

In FIGS. 8A and 8B, the circuit board is fully inserted, and the member 66 is in its closed position. As best viewed in FIG. 8A, there is a slight, such as 0.1 inch (2.5 mm), clearance between the step 106 of the barbed portion 80 and the trailing edge 52 of the hole 50 in the circuit board. The locking device 94 for releasably engaging the nonhinged end 64 of the member 66 is not shown.

Figure 9A:
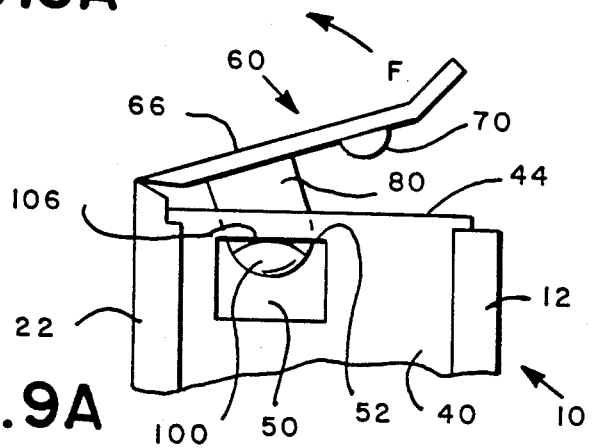
Figure 9B:
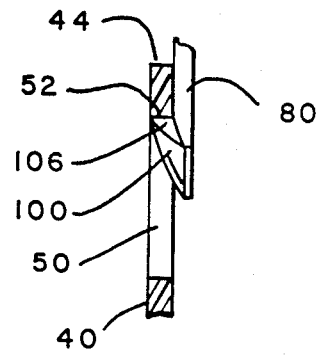

In FIGS. 9A and 9B, the member 66 is shown being displaced from its closed position towards its open position. As shown, the step 106 contacts the trailing edge 52 of the hole 50 to exert an extraction force on the circuit board 40, notably to free the leading edge (not shown) of the circuit board from a connector (not shown).

Figure 10A:
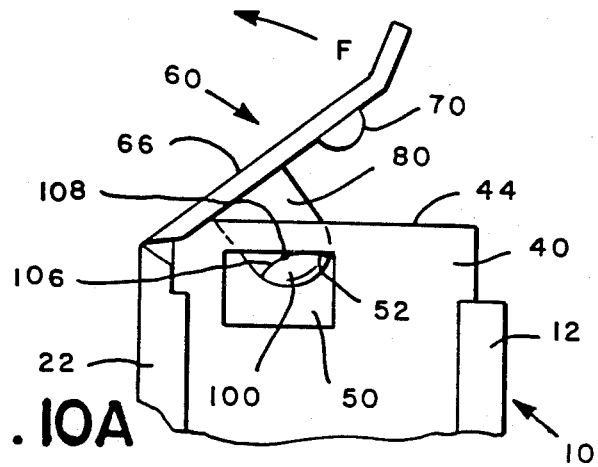
Figure 10B:
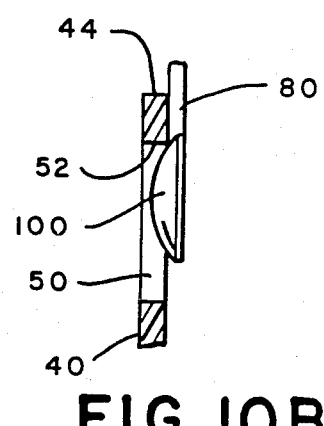

In FIGS. 10A and 10B the member 66 is further displaced towards it open position. As best viewed in FIG. 10A, the step 106 has largely lost contact with the trailing edge 52 of the hole 50, but the point 108 of maximum thickness for the region 100 is still in contact therewith. Thus, an extracting force is still applied to the circuit board.

Figure 11A:
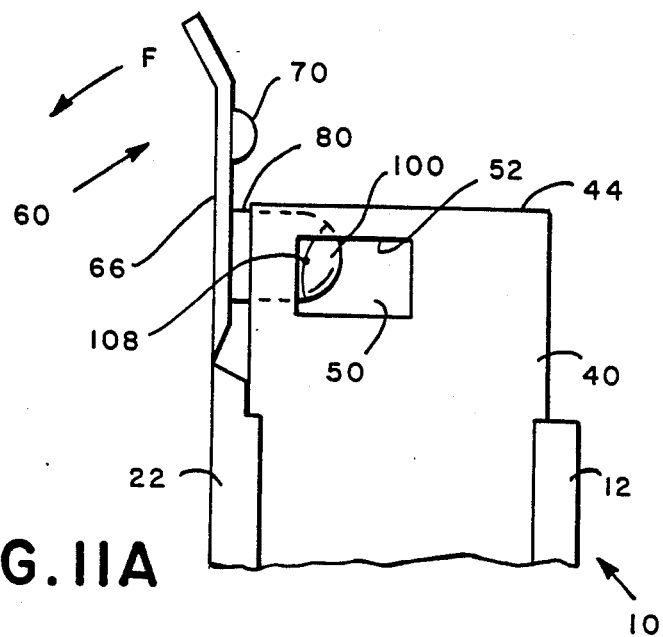
Figure 11B:
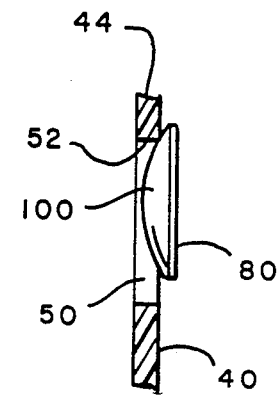

In Figs. 11A and 11B, the member is further displaced towards its open position. The point 108 has lost contact with the trailing edge 52 of the hole 50, but the region of increased thickness 100 is still in contact therewith, albeit on the tapered portion of its surface. The situation is similar to that described with respect to FIGS. 5A and 5B in that the extraction force (in this case) is somewhat tenuous and ill defined.

Figure 12A:
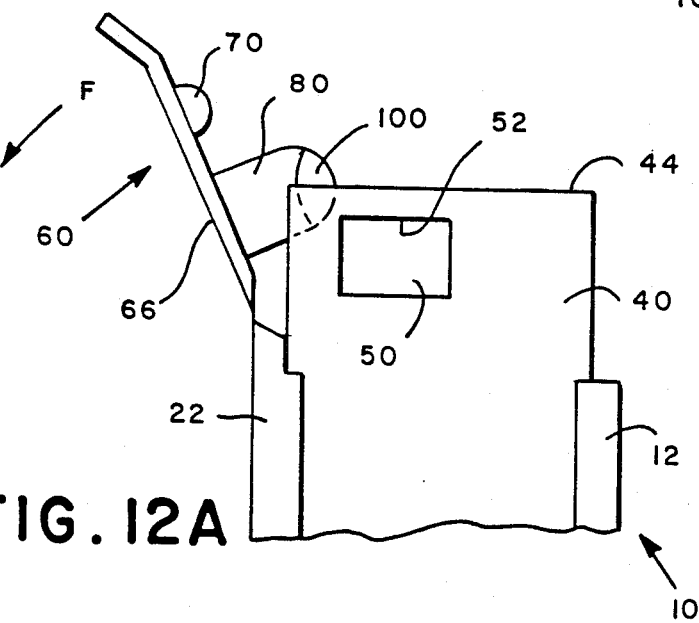
Figure 12B:
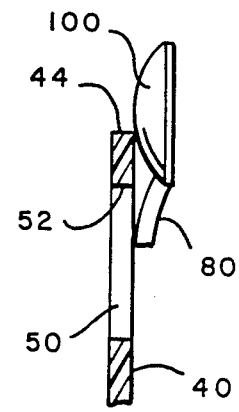

In FIGS. 12A and 12B, the barbed portion 80 is shown to have deflected, no longer exerting an upward force on the trailing edge 52 of the hole 50 in the circuit board 40. Consequently, the member 66 is rather free to be moved more towards its open position.

Figure 13A:
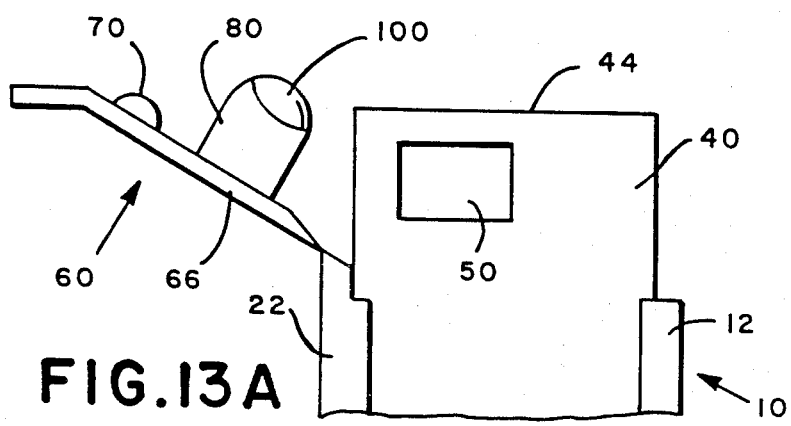
Figure 13B:
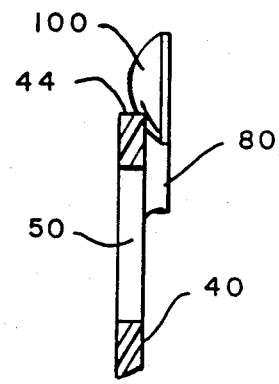

In FIGS. 13A and 13B the member 66 is shown in its open position allowing for the circuit board to be finally extracted by hand from the card guide 10.

Advantages of the invention include:

a. providing an aid for circuit board insertion and extraction that is integral with the card guide, and hence can not be misplaced;

b. the insertion/extraction apparatus, including the locking device, can be formed with the card guide at minimal additional expense; and c. by closing over the trailing edge of the circuit boards, the member 66 conveniently provides slot number identification, as indicated by the numerals 2 through 6 visible in FIG. 1.

What is claimed is:

1. Apparatus for aiding in the insertion and extraction, respectively, of a circuit board into and from, respectively, a card guide, wherein the circuit board has a trailing edge and a hole disposed through a trailing edge portion thereof, wherein the hole has a trailing edge, and wherein the card guide has a hinge side and a nonhinge side, each side of the card guide being adapted to receive a side edge of the circuit board, comprising:
  a lever-like, rigid, elongated member having a hinged end and a nonhinged end, hingedly attached at the hinged end thereof to the hinge side of the card guide and movable in a range of positions between an open position wherein the member is positioned to allow a circuit board to be inserted into the card guide and a closed position wherein the member extends substantially from the hinge side of the card guide to the nonhinge side of the card guide; and
  bump means forming a region of increased thickness on the member for contacting the trailing edge of the circuit board when the circuit board is in the card guide and the member is moved towards its closed position; and barb means disposed on the member having a trailing edge forming a step for engaging the trailing edge of the hole when a circuit board is in the card guide and the member is moved towards its open position.

2. Apparatus according to claim 1 wherein the member is hingedly attached to the hinge side of the card guide by a living hinge formed integrally with the hinged end of the member and the one side of the card guide.

3. Apparatus according to claim 1 wherein the hinge side of the card guide extends past the trailing edge of the circuit board when fully inserted into the card guide.

4. Apparatus according to claim 1 further comprising: locking means disposed on the nonhinge side of the card guide for releasably engaging the nonhinged end of the member.

5. Apparatus according to claim 1 further comprising: a slot bifurcating the member longitudinally into two bifurcated portions extending at least a portion of the length of the member and allowing at least a portion of the trailing edge of the circuit board in the card guide to extend through the member.

6. Appartus according to claim 5 wherein the slot extends substantially from the hinged end of the member towards the nonhinged end of the member.

7. Apparatus according to claim 1:
wherein the member has an underside;
wherein the barb means is generally rectangular and has a base edge contiguous with the underside of the member, an inward side edge perpendicular to the underside of the member, an outward side edge perpendicular to the underside of the member, a leading edge, an inner surface, and an outer surface; and wherein a region of increased thickness is formed on the inner surface of the barb means extending from the leading edge of the barb means, where its thickness is substantially zero, approximately one quarter the distance towards the base edge of the barb means, where its thickness is greater and forms the step for engaging the trailing edge of the hole in the circuit board.

8. Apparatus according to claim 7 wherein the step extends generally perpendicularly across the barb means from the inward side edge thereof towards the outward side edge thereof.

9. Apparatus according to claim 8 wherein the step is of minimum thickness at both ends thereof and is of maximum thickness at a point which is approximately midway between the inward and outward side edges of the barb means.

10. Apparatus according to claim 9 wherein the maximum thickness of the step is approximately equal to the thickness of a circuit board.

11. Apparatus according to claim 1 wherein the member has an underside and wherein the bump means is semicylindrical having a flat surface and a rounded surface and extends transversely across the underside of the member, the flat surface of the bump means being contiguous with the underside of the member and the rounded surface contacting the trailing edge of the circuit board.

12. Apparatus according to claim 11 wherein the transverse dimension of the bump means is approximately five times the thickness of a circuit board.

* * * * *